United States Patent [19]
Tsukada

[11] Patent Number: 5,808,505
[45] Date of Patent: Sep. 15, 1998

[54] SUBSTRATE BIASING CIRCUIT HAVING CONTROLLABLE RING OSCILLATOR

[75] Inventor: Shyuichi Tsukada, Tokyo, Japan

[73] Assignee: NEC Corporation, Tokyo, Japan

[21] Appl. No.: 924,735

[22] Filed: Sep. 5, 1997

Related U.S. Application Data

[63] Continuation of Ser. No. 605,588, Feb. 22, 1996, abandoned, which is a continuation of Ser. No. 508,972, Jul. 28, 1995, abandoned, which is a continuation of Ser. No. 248,674, May 25, 1994, abandoned.

[30] Foreign Application Priority Data

May 25, 1993 [JP] Japan ................................ 122226/1993

[51] Int. Cl.$^6$ ........................................................ G05F 1/10
[52] U.S. Cl. ............................ 327/536; 327/535; 327/537
[58] Field of Search ............................. 257/299; 307/109, 307/110; 327/156, 157, 535, 536, 537; 331/57

[56] References Cited

U.S. PATENT DOCUMENTS

| 4,455,493 | 6/1984 | Morton et al. | 327/537 |
|---|---|---|---|
| 4,692,689 | 9/1987 | Takemae | 327/537 |
| 4,695,745 | 9/1987 | Mimoto et al. | 327/536 |
| 4,853,654 | 8/1989 | Sakurai | 331/57 |
| 5,041,739 | 8/1991 | Goto | 327/536 |
| 5,043,597 | 8/1991 | Furvyama et al. | 257/299 |
| 5,066,870 | 11/1991 | Kobatake | 327/536 |
| 5,180,995 | 1/1993 | Hayashi et al. | 331/57 |
| 5,302,919 | 4/1994 | Abe | 331/57 |
| 5,347,171 | 9/1994 | Cordoba et al. | 327/537 |

FOREIGN PATENT DOCUMENTS 62-222713 9/1987 Japan .

OTHER PUBLICATIONS

"Design of CMOS Ultra LSI", issued on Apr. 25, 1989, pp. 193–195.

Primary Examiner—Toan Tran
Assistant Examiner—Jeffrey Zweizig
Attorney, Agent, or Firm—Young & Thompson

[57] ABSTRACT

A substrate biasing circuit is disclosed which includes a ring oscillator oscillating to a drive pulse signal, a charge pump circuit connected to the ring oscillator to receive the drive pulse signal and generating a substrate-bias voltage in response thereto, and a current control circuit connected to the ring oscillator. The ring oscillator includes a plurality of delay circuits and the current control circuit controls each of the delay circuits such that a current flowing there through is stabilized against the variation in power voltage and relative to a threshold voltage of a transistor for the charge pump circuit.

9 Claims, 4 Drawing Sheets

SUBSTRATE BIASING CIRCUIT HAVING CONTROLLABLE RING OSCILLATOR

This application is a continuation of application Ser. No. 08/605,588, filed Feb. 22, 1996, which is a continuation of Ser. No. 08/508,972, filed Jul. 28, 1995, which is a continuation of Ser. No. 08/248,674, filed May 25, 1994, all of which are now abandoned.

BACKGROUND OF THE INVENTION

This invention relates to a substrate biasing circuit and, more particularly, to such a circuit that supplies a constant bias to a semiconductor substrate on which a semiconductor memory circuit is fabricated.

In a semiconductor memory device, a semiconductor substrate is generally supplied with a bias voltage in order to improve access speed and/or data hold characteristics. For example, in a semiconductor memory device having a p-type semiconductor substrate and operating on a positive power supply voltage, a negative bias voltage is applied to the substrate. A substrate biasing circuit is used to generate and supply the substrate-bias voltage and is composed of an oscillator circuit for generating an oscillation signal of a certain frequency and a charge-pump circuit generating the substrate-bias in response to the oscillation signal.

Because of no externally provided components being required, a ring oscillator is widely employed as the oscillator circuit. The ring oscillator includes an odd number of delayed-inverter circuits connected in the form of a ring. The oscillation frequency of the ring oscillator depends on the delay time of each delayed-inverter circuit. This delay time is shortened by an increase in power supply voltage or by the threshold voltage of transistors for the delayed-inverter circuits being lower than a design value. This is because the increased power supply voltage becomes or the lowered threshold voltage of the transistor causes the gate source bias voltage of the transistor becomes to be deepened and the current ability thereof to be made large. As a result, the oscillation frequency of the ring oscillator becomes high. Conversely, when the power supply voltage is reduced or the threshold voltage of the transistor becomes larger than the design value, the oscillation frequency becomes low.

On the other hand, the substrate-bias voltage generated by the charge-pump circuit depends on the frequency of the oscillation signal from the ring oscillator and is hence changed by the variation in the power supply voltage and/or the deviation in threshold voltage of the transistor from design value. The change in substrate-bias voltage brings about a change in effective threshold voltage in operation of each of the transistors constituting the memory circuit to make the data access operation unstable. At the worst, error in access or destruction of stored data, takes place.

Since the change in oscillation frequency of the delayed-inverter circuit contributes to change in delay time, it may be difficult to stabilize the delay time irrespective of variation in the power supply voltage. For this purpose, it is proposed in Japanese Patent Laid-Open Application No. Sho. 62-222713 to insert a constant current source in series with one of transistors constituting the delayed-inverter circuit. The current source thus inserted is use to make the current flowing through the circuit constant irrespective of the variation in power supply voltage. The delay time is thus made constant. It is further disclosed in a text book titled "Design of CMOS Ultra LSI" issued on Apr. 25 (1989), Baihoukan, that it is possible to control the oscillation frequency by attaching current sources to respective transistors of a CMOS inverter, the current of the current sources being provided with a desired characteristic.

It should be noted, however, that the substrate-bias voltage depends not only on the oscillation frequency of the ring oscillator but also on the current ability of transistors constituting the charge pump circuit. For example, even if the oscillation frequency of the ring oscillator is made constant by the means disclosed in the above-mentioned references against the increase in the power supply voltage, the current ability of the transistors for the charge pump circuit increases due to increase in power supply voltage, resulting in changing the substrate-bias. It is therefore needed, when power supply voltage rises, to lower the oscillation frequency of the ring oscillator to maintain the substrate-bias voltage constant. When the threshold value of the transistors in the charge pump circuit is made larger than the design value due to variation in the fabrication process thereof, the current ability of the transistors decreases correspondingly. Hence in this case, it is necessary to increase the oscillation frequency of the ring oscillator to compensate for the decrease in current ability.

As stated above, in order to keep the substrate-bias constant, the oscillation frequency of the ring oscillator must be controlled in response to circuit constructions and operations of both the ring oscillator and the charge pump circuit. A control circuit for that purpose is not taught, by the prior art mentioned above.

SUMMARY OF THE INVENTION

It is therefore a principal object of the present invention to provide a substrate biasing circuit capable of generating and outputting a constant substrate-bias voltage against variations in power supply voltage and deviations of the threshold voltage of transistors from design value.

A substrate biasing circuit according to the present invention comprises a charge pump circuit receiving a drive pulse signal and generating a substrate-bias voltage in response thereto, a ring oscillator including a plurality of delayed-inverter circuits connected in a ring form to produce and supply the drive pulse signal to the charge pump circuit, and a current control circuit for controlling each of the delayed-inverter circuits such that a current flowing therethrough is stabilized against variation in a power supply voltage and is relative to a threshold voltage of a transistor contained in the charge pump circuit.

BRIEF DESCRIPTION OF THE DRAWINGS

The above-mentioned and other objects, features and advantages of this invention will become more apparent by reference to the following detailed description taken in conjunction with the accompanying drawings, wherein.

DETAILED DESCRIPTION OF THE PREFERRED EMBODIMENTS

Figure 1:
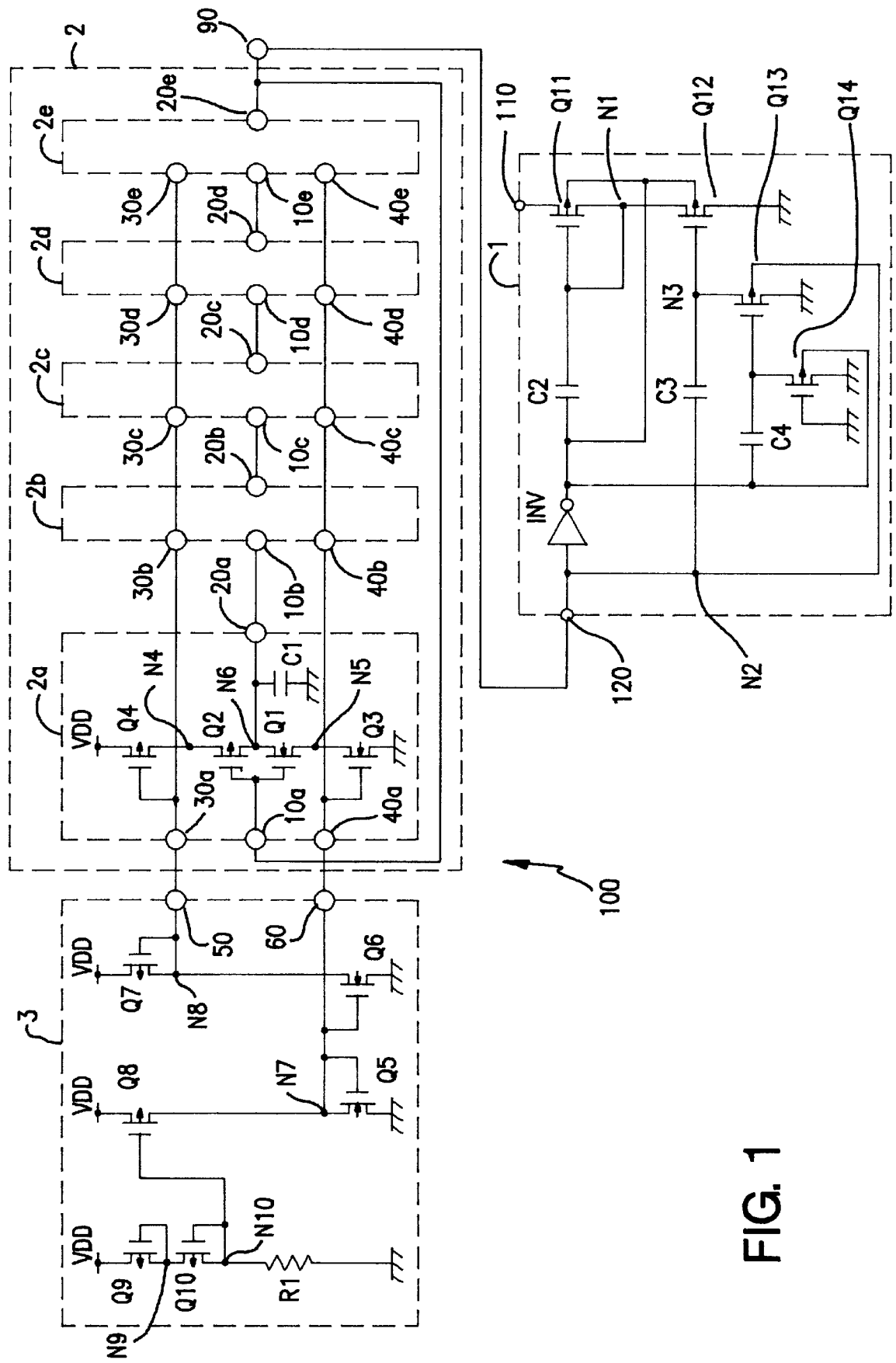
FIG. 1 is a circuit diagram illustrative of a substrate biasing circuit according to a first embodiment of the present invention.

Referring to FIG. 1, a substrate biasing circuit 100 according to the first embodiment of the present invention includes a charge pump circuit 1 having an output terminal 110 connected to a semiconductor substrate (not shown) on which this circuit is fabricated together with a memory circuit (not shown). The circuit 100 further includes a ring oscillator 2 supplying a drive pulse signal to the charge pump circuit 1. The ring oscillator 2 consists of delayed-inverter circuits 2a, 2b, 2c, 2d and 2e cascaded at an odd number of stages (five stages in this embodiment) in the ring form as shown. The current flowing in each of these circuits 2a–2e 2 is controlled by a current control circuit 3 which will be described in detail later.

The charge pump circuit 1 has an input terminal 120 receiving an oscillation signal from the ring oscillator 2 as the drive pulse, signal. The terminal 120 is connected to the input terminal of an inverter INV and one terminal of a capacitor C3. The output of the inverter INV is connected to the respective terminals of capacitors C2 and C4. The other terminal of a capacitor C2 is connected to the gate of a p-channel MOS transistor Q11 and to a node N1. The source-drain path of Q11 is connected between the voltage output terminal 110 and the node N1. The back gate of transistor Q11 is connected to the output of the inverter INV. The other terminal of the capacitor C3 is connected to the gate of a p-channel MOS transistor Q12 of which the drain-source path is connected between the node N1 and a ground and the back gate of which is connected to the output of the inverter INV. The other terminal of the capacitor C4 is connected to the gate of a p-channel MOS transistor Q13 of which the drain-source path is connected between node N3, which is the other terminal of the capacitor C3, and ground. The back gate of the transistor Q13 is connected to the drive pulse input terminal 120. There is further provided a p-channel MOS transistor Q14 with a gate grounded and a drain-source path connected between the other terminal of the capacitor C4 and the ground. The back gate of the p-channel transistor Q14 is connected to the output of the inverter INV.

The drive pulse signal supplied to the terminal 120 have an amplitude corresponding to the potential between a power supply voltage (VDD) line and a ground (GND) line. When the drive pulse at the drive-pulse input terminal 120 changes from VDD to GND, the level of the node N3 drops by VDD because of the coupling through the capacitor C3. When the nods N2 accordingly drive pulse input terminal 120) is at VDD, the level of the node N3 is forced to be at GND level by the p-channel transistor Q13 and the capacitor C4. Owing to this, when the node N2 becomes GND, the level of the node N3 goes to -VDD level, and in turn the voltage applied to the gate of the p-channel transistor Q12 becomes -VDD. Thus the p-channel transistor Q12 is turned on, then the node N1 being dropped to GND.

When the level at drive pulse input terminal 120 changes from GND to VDD, and correspondingly the output of the inverter INV goes from VDD to GND then the node N1 drops by VDD to -VDD through the coupling of the capacitor C2. In turn, the p-channel transistor Q11 is turned on, and thereby the potential of the substrate-bias output terminal 110 falls until the potential between the substrate-bias output terminal 110 and the node N1 reaches below the threshold voltage of the p-channel transistor Q11.

Subsequently the node N2 goes from VDD to GND, which causes the node N1 to go to GND, and consequently the p-channel transistor Q11 is turned off.

As described above, every time the incoming drive pulse of a specified frequency changes from VDD to GND and from GND to VDD, the voltage at the substrate-bias output terminal 110 is affected by the negative level until a certain voltage at which it becomes stabilized.

The ring oscillator 2 consists of the delay circuits 2a, 2b, 2c, 2d, and 2'e connected in a ring form. Herein all the delay circuits have the same configuration, and hence the delay circuit 2a only will be set forth.

The delay circuit 2a consists of a p-channel transistor Q2 and a n-channel transistor Q1 connected in series between nodes N4 and N5 and via a node N6, their gates being connected to a common input terminal 10a; a capacitor C1 connected between the node N6 and GND, the output terminal 20a of which being connected to the node N6; a p-channel transistor Q4 connected between VDD and the node N4, the gate of which being connected to a control terminal 30a; and an n-channel transistor Q3 connected between GND and the node N5, the gate of which being connected to a control terminal 40a. In the ring oscillator 2, the output terminal 20a of the preceding-stage delay circuit is connected to the input terminal 10a of each delay circuit, and the output terminal 20a of the last-stage delay circuit 2e is connected to drive pulse input terminal 120 of the charge pump circuit 1 through output terminal 90 of the ring oscillator 2 and also to the input terminal of the first stage delay circuit.

Figure 2A:
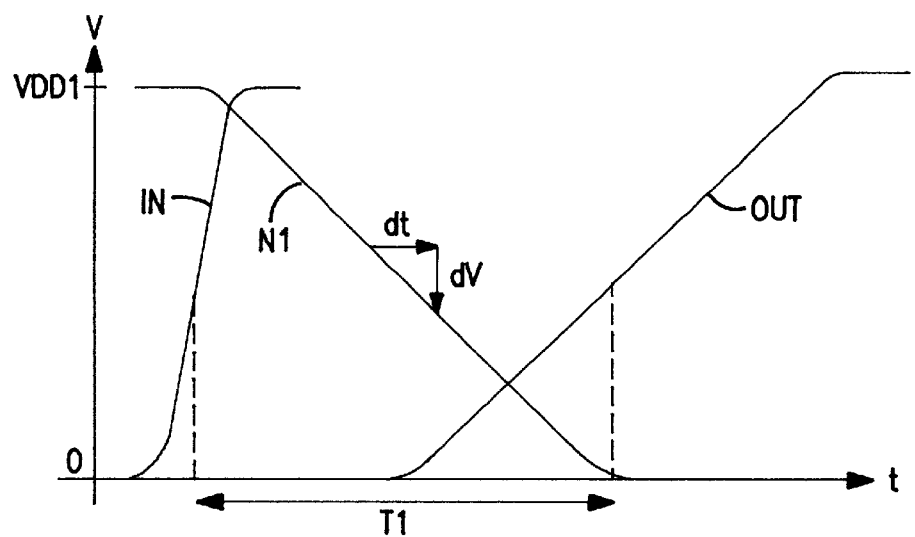
FIG. 2(a) is a graph for illustrating a delay time of a delayed-inverter circuit shown in FIG. 1 when the power supply voltage is high.

The delay time of the delay circuit 2a depends on magnitude of charge for the charging capacitor C1, i.e. the amount of the electric current flowing. The current flowing through the inverter constructed of p-channel and n-channel transistors Q2, Q1 is determined by the control voltage applied to the gates of p-channal and n-channel transistors Q4, Q3. Therefore, the current flowing through the inverter can be controlled constantly, and thereby constant current can be fed without being affected by variation of power supply voltage, which enables the control of delay time. Refer to FIG. 2(a) which plots an input signal IN supplied to the input terminal 10, an output signal OUT from the output terminal 20, and delay time of the delay circuit when operating at power supply voltage VDD1. When the input signal IN supplied to the input terminal 10 changes from GND to VDD, the p-channel transistor Q2 goes from off-state to on-state, and the n-channel transistor Q1 goes from on-state to off-state. Thereby the potential of the node N6 changes gradually from VDD to GND. Now letting I be the current constant of n-channel and p-channel transistors Q3, Q4, and C be the total capacitance of the node N6 which is the sum of capacitor C1 and parasitic capacitance, the potential change rate is represented by $$dV/dt = I \cdot (1/C) \tag{1}$$

Since current constant I and the total capacity C are independent of variation of power supply voltage VDD1, the rate of change of the potential of the node N6 is unvaried. It follows that the time taking for the potential of the node N6 to become VBD1 to GND is proportional directly to power supply voltage VDD1 or its amplitude. Hence the delay time T1 between the input signal IN and the output signal OUT are proportional directly to power supply voltage VDD1. Likewise when the input signal IN becomes GND to VDD1, the absolute value of dV/dt is definite and hence the delay time is proportional directly to power supply voltage VDD1.

Figure 2B:
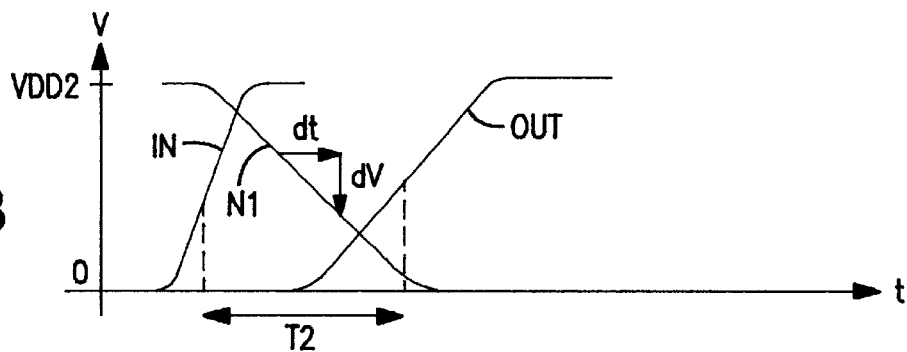
FIG. 2(b) is a graph for illustrating the delay time of the delayed-inverter circuit when the power supply voltage is low.

Referring to FIG. 2(b) showing graph by the operation at an alternative power supply voltage VDD2 lower than VDD1, as understood from which, the rate of change of the potential dV/dt is equal to FIG. 2(a), and the delay time in FIG. 2(b) where the voltage amplitude of the note N6 is small is shorter than FIG. 2(a).

Figure 2C:
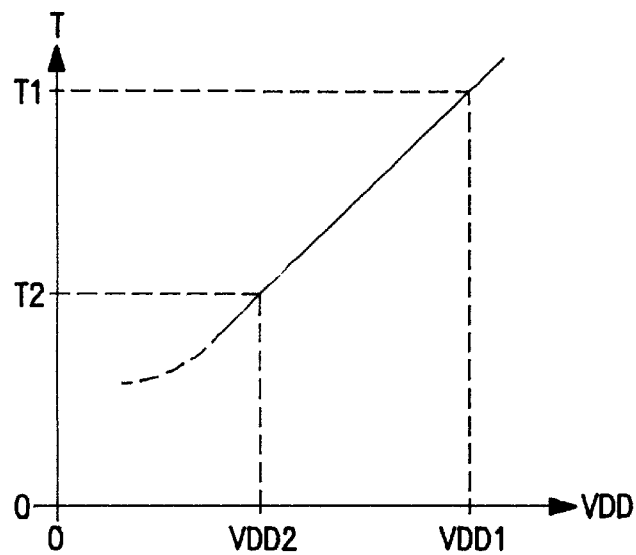
FIG. 2(c) is a graph indicating the relationship between the power supply voltage and the delay time of the delayed-inverter circuit.

As shown in FIG. 2(c), therefore it is understood that the delay circuit 2a is proportional directly to power supply voltage VDD, and its delay time is increased.

The current source circuit 3 consists of a p-channel transistor Q8 connected between VDD and a node N7; an n-channel transistor Q5 connected between the node N7 and GND, and the gate of which being connected to the node N7; a n-channel transistor Q6 connected between a node N8 and GND, and the gate of which being connected to the node N7 and output terminal 60; and a p-channel transistor Q7 connected between the node N8 and VDD and the gate of which is connected to output terminal 50. The output terminal 50 is connected to the respective input terminals 30a–30c of the delay circuits 2a, 2b, 2c, 2d and 2e, and output terminal 60 is similarly connected to input terminals 40a–40e of the delay circuits.

Now n-channel transistors Q5 and Q6 constitutes a current Miller circuit, and hence the current flowing through the n-channel transistor Q6 is determined by the n-channal transistor Q5, and the current flowing through the n-channel transistor Q5 is determined by the current flowing through the p-channel transistor Q8. The current flowing through the p-channel transistor Q8 is determined by the voltage between the gate and source thereof. The p-channel transistor Q4 in the delay circuit 2a and the p-channel transistor Q7 constitutes another current miller circuit. The n-channel transistor Q3 in the delay circuit 2a and the n-channel transistor Q6 constitutes another current miller circuit. The current flowing through all the delay circuits 2a, 2b, 2c, 2d, and 2e is determined by the current through the p-channel transistor Q8. In this embodiment, the ratio of an output current to an input current of each of the current miller circuits is designed to be 1. Therefore, respective currents flowing through all the delay inverter 2a through 2e are the same.

The current source circuit 3 further comprises a p-channel transistor Q9 connected between VDD and a node N9, the gate of which being connected to the node N9; a p-channel transistor Q10 connected between nodes N9 and N10, the gate of which being connected to the node N10, and a resistor R1 connected between the node N10 and GND. The node N10 is connected to the gate of the transistor Q8.

Letting Vtp be the threshold value of each p-channel transistor, then the voltage of node N10 is VDD−2·|Vtp| |Wherein |Vtp| represents the absolute value of Vtp) which is supplied to the gate of the p-channel transistor Q8. It follows that the voltage between the gate and source of the p-channel transistor Q8 is 2 Vtp. By the way the current flowing the p-channel transistor Q8 is determined by the voltage between the gate and source, and it is only the voltage depending on the threshold voltage Vtp that is applied between the gate and source. The current flowing through the p-channel transistor Q8 depends only on Vtp and not on VDD.

Thus letting β and IQ8 be the conductance constant and current constant of the p-channel transistor Q8, then $$IQ8 = (1/2) \cdot \beta \cdot (2|Vtp| - |Vtp|^2) \quad (2)$$
$$= (1/2) \cdot \beta \cdot (|Vtp|^2)$$

Furthermore since the delay time of the delay circuit is inversely proportional to the current, the delay time T is expressed in relation to the threshold voltage Vtp by $$T = 1/|Vtp|^2 \quad (3)$$

Figure 3:
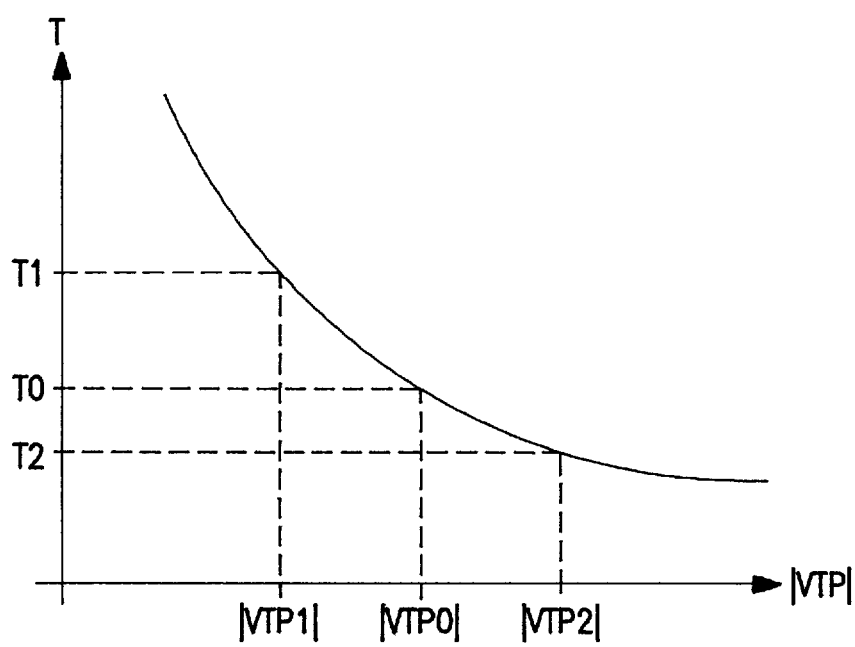
FIG. 3 is a graph indicating the relationship between the threshold voltage of a transistor and the delay time of the delayed-inverter circuit.

Therefore the relationship between the absolute value of the threshold voltage Vtp and the delay time based on the above equation (3) is indicated in FIG. 3. As is apparent from FIG. 3, the smaller the threshold value of the transistor, the longer the delay time is, as the relation of T1 to |Vtp$^1$| and the larger the threshold value of the transistor, the shorter the delay time is, as the relation of T2 to |Vtp$^2$|. Hence when p-channel transistors Q11 and Q12 degrades, i.e. when the p-channel transistors have a greater threshold due to variation in the device fabrication process, then the voltage on the node N10 is increased, which increases the currents flowing the p-channel transistors Q4 and the n-channel transistor Q3 of the delay circuit 2a, which in turn reduces the delay time, resulting in increasing the output frequency of the ring oscillator 2. Conversely when the p-channel transistors have a smaller threshold, then the currents flowing the p-channel transistors Q4 and the n-channel transistor Q3 of the delay circuit 2a is decreased, which reduces the delay time, resulting in decreasing the output frequency of the ring oscillator 2. The ability of charge pump circuit 1 depends on the frequency of the drive pulse the higher the frequency is, the higher the ability is, and the lower the frequency is, the lower ability is. In this way, even if the threshold value of the transistor changes, the frequency can be altered according to the change, and thereby the ability of the charge pump circuit 1 can follow the change to enable to output an unvaried bias.

Figure 4:
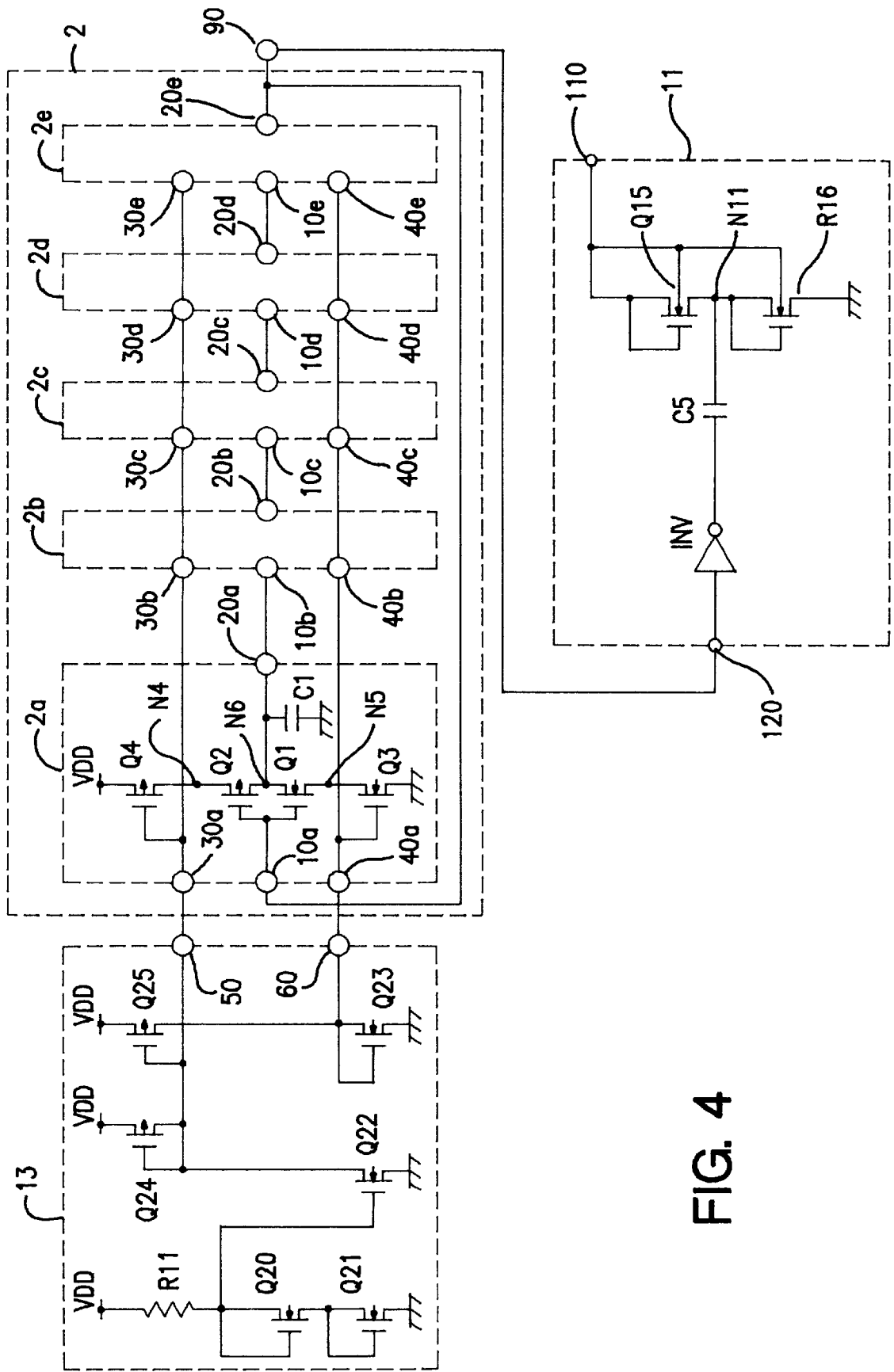
FIG. 4 is a circuit diagram illustrative of a substrate biasing circuit according to a second embodiment of the present invention.

Turning to FIG. 4, a substrate biasing circuit according to the second embodiment of the present invention includes a charge pump circuit 11, a ring oscillator 2 feeding drive pulses to the charge pump circuit 11, and a current control circuit 13. Ring oscillator 2 is the same as that of FIG. 1, and its explanation will be therefore omitted.

The charge pump circuit 11 comprises an n-channel transistor Q15 with a gate connected to the substrate-bias output terminal 110, and source/drain connected between the substrate-bias output terminal 110 and a node N11, and an n-channel transistor Q16 with a gate connected to the node N11 and source-drain path connected between the mode N11 and GND, an inverter INV with the input connected to the drive-pulse input terminal and a capacitor C5 connected between the output of the inverter INV and the node N11.

This charge pump circuit 11, when the drive-pulse input terminal 120 is at GND, drives the node N11 N-1 from VDD which is raised in virtue of the coupling with capacitor C5 down to GND by the n-channel transistor Q16 of diode construction, and when drive pulse input the terminal 120 becomes raised from GND to VDD, drives the node N11 from GND down by VDD in virtue of the coupling with the capacitor C5, thereby the voltage of the substrate-bias output terminal 110 being lowered down to a negative level.

This charge pump circuit 11 employs n-channel transistors as Q15 and Q16 which is variable in ability due to deviation from the design values based on variation in fabrication process, etc. For suppressing this variation in ability of the charge pump circuit 11, it is needed to control the frequency of the drive pulse outputted from the ring oscillator 2 by the use of threshold value Vtn in the same way as FIG. 1.

For this purpose, a current control circuit 13 of the present invention rises a resistor R11, four n-channel transistors Q20 through Q23, and two p-channel transistors Q24, Q25, and interconnected as shown. Especially the current flowing through transistor Q22 is correspondent to only the threshold voltage of the n-channel transistor. This current flows to each delay inverter through the current miller circuits each consisting of transistors Q24 and Q25; Q25 and Q24; and Q23 and Q23; respectively, and the values of these currents are all the same. Thus also in the present embodiment a constant substrate bias is obtained.

Similar effect is obtained also in the case of modification in FIG. 1 of replacing by transistors of the other conductivity type, using inversely VDD and GND, and connecting the charge pump circuit 11 instead of the charge pump circuit 1 to output terminal 90. Furthermore the number of transistor pairs such as Q9, Q10 or Q20 or Q21 of diode-connection may be increased.

As described above, a current source is placed between the terminals of each inverter-structure transistors constituting a delay circuit, and the current of the current source is controlled by the threshold value so that when the absolute value of the threshold voltage is lower, the current is correspondingly decreased to increase the delay time. In addition, since the charge and discharge at the output terminals of the inverter-structure transistors are carried out by the current of the current source. By these, the rate of change of the potential at the output terminal is constant independent of variation of power supply. Since the amplitude of the output voltage increases with increasing power supply voltage, the frequency of the drive pulse outputted from the ring oscillator can be decreased. Conversely when the absolute value of the threshold voltage is higher, the current is increased and thereby the delay time is decreased. Thus since the lower the power supply voltage is, the larger the amplitude of the output voltage becomes, it is possible to increase the frequency of the drive pulse outputted from the ring oscillator. Therefore when the ability of the charge pump circuit is increased, i.e. when the power supply voltage becomes higher, or when the absolute value of the threshold value is decreased, then the frequency of the drive pulse is decreased to suppress the ability of the charge pump circuit. When the ability of the charge pump circuit decreases, i.e. when power supply voltage is lower, or the absolute value of the threshold value increases, the frequency of the drive pulse is increased so that the ability of the charge pump circuit is improved by increasing the frequency of the drive pulse. In this way the substrate-bias outputted from the substrate-bias generator can be maintained constant.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is thereof contemplated that the appended claims will cover any modifications or embodiment as fall within the true scope of the invention.

What is claimed is:

1. A substrate biasing circuit comprising a charge pump circuit receiving a drive pulse signal and generating a substrate-bias voltage at an output terminal in response thereto, said charge pump circuit including an output transistor coupled to said output terminal to output said substrate-bias voltage, a ring oscillator including a plurality of delayed-inverter circuits connected in a ring form to produce said drive pulse signal, said drive pulse signal having a frequency, and a current control circuit controlling each of said delayed-inverter circuits such that the frequency of said drive pulse signal is increased when a threshold voltage of said output transistor is larger than a predetermined value and is decreased when said threshold voltage of said output transistor is smaller than said predetermined value.

2. The circuit as claimed in claim 1, wherein each of said delayed-inverter circuits includes a first transistor of a first channel type connected between a first power supply line and a first node and having a gate connected to a first control terminal, a second transistor of said first channel type connected between said first node and a second node and having a gate connected to an input terminal, a third transistor of a second channel type connected between said second node and a third node and having a gate connected to said input terminal, and a fourth transistor of said second channel type connected between said third node and a second power supply line and having a gate connected to a second control terminal.

3. The circuit as claimed in claim 2, wherein said current control circuit includes a fifth transistor of said first channel type connected between said first power supply line and said first control terminal and having a gate connected to said first control terminal, a sixth transistor of said second channel type connected between said first control terminal and said second power supply line and having a gate connected to said second control terminal, a seventh transistor of said second channel type connected between said second control terminal and said second power supply line and having a gate connected to said second control terminal, an eighth transistor of said first channel type connected between said second control terminal and said first power supply line and having a gate connected to a third control terminal, and a bias circuit supplying a bias voltage to said third control terminal.

4. The circuit as claimed in claim 3, wherein said output transistor is of said first channel type and is connected between a fourth node and said output terminal, said output transistor operating, when said drive pulse signal is at a first level, to output said substrate-bias voltage at said output terminal, said charge pump circuit further including a restore transistor of said first channel type connected between said fourth node and said second power supply line and operating, when said drive pulse is at a second level, to connected said fourth node to said second power supply line.

5. The circuit as claimed in claim 4, wherein said bias circuit includes a ninth transistor of said first channel type connected between said first power supply line and a fifth node and having a gate to said fifth node, a tenth transistor of said first channel type connected between said fifth node and said third control terminal and having a gate connected to said third control terminal, and a resistive element connected between said third control terminal and said second power supply line.

6. A substrate biasing circuit according to claim 1, wherein:
said current control circuit includes a current controlling transistor, said current controlling transistor also having said threshold voltage, and said current controlling transistor controlling each of said delayed-inverter circuits such that the frequency of said drive pulse signal is increased when said threshold voltage is larger than a predetermined value and is decreased when said threshold voltage is smaller than said predetermined value.

7. A circuit comprising:

a first transistor of a first channel type having a source connected to a first voltage supply line, a drain connected to a first node and a gate connected to said first node;

a second transistor of said first channel type having a source connected to said first node, a drain connected to a second node and a gate connected to said second node;

a resistive element connected between said second node and a second power supply line; and a third transistor of said first channel type having a source connected to said first power supply line, a drain connected to an output node and a gate connected to said second node, such that a current at said output node is determined by a threshold voltage of at least one of said first, second and third transistors.

8. A circuit comprising:

a delayed-invertor including, a first transistor of a first channel type connected between a first power supply line and a first node and having a gate connected to a first control terminal;

a second transistor of said first channel type connected between said first node and an output node and having a gate connected to an input node;

a third transistor of a second channel type connected between said output node and a second node and having a gate connected to said input node, said first channel type being opposite to said second channel type, and a fourth transistor of said second channel type connected between said second node and a second power supply line and having a gate connected to a second control terminal; and a current control circuit including, a fifth transistor of said first channel type connected between said first power supply line and a third node and having a gate connected to said third node;

a sixth transistor of said first channel type connected between said third node and a fourth node and having a gate connected to said fourth node;

a resistive element connected between said fourth node and said second power supply line;

a seventh transistor of said first channel type connected between said first power supply line and said second control terminal and having a gate connected to said fourth node;

an eighth transistor of said second channel type connected between said second control terminal and said second power supply line and having a gate connected to said second control terminal;

a ninth transistor of said first channel type connected between said first power supply line and said first control terminal and having a gate connected to said first control terminal; and a tenth transistor of said second channel type connected between said first control terminal and said second power supply line and a gate connected to said second control terminal.

9. A substrate biasing circuit comprising:

a charge pump circuit receiving a drive pulse signal at an input terminal and generating a substrate bias voltage at an output terminal, said charge pump circuit comprising, an inverter with an inverter input connected to said input terminal and to an input to a first capacitor, and with an inverter output connected to inputs to second and third capacitors, a first transistor with one terminal connected to said output terminal, a second terminal and a gate connected to an output from said second capacitor, and a back gate connected to said inverter output, a second transistor with one terminal connected to said second capacitor output, a second terminal connected to ground, a gate connected to an output from said first capacitor, and a back gate connected to said inverter output, a third transistor with one terminal connected to said first capacitor output, a second terminal connected to ground, a gate connected to an output from said third capacitor, and a back gate connected to said inverter input, and a fourth transistor with one terminal connected to said third capacitor output, a second terminal and a gate connected to ground, and a back gate connected to said inverter input;

a ring oscillator including a plurality of ring-connected delayed-inverter circuits providing said drive pulse signal with a frequency to said input terminal; and a current control circuit controlling said delayed-inverter circuits so that the frequency of the drive pulse signal increases when a threshold voltage of said first transistor is larger than a predetermined value and decreases when the threshold voltage of said first transistor is smaller than the predetermined value.

* * * * *